US010254664B2

(12) United States Patent
Erath

(10) Patent No.: US 10,254,664 B2
(45) Date of Patent: Apr. 9, 2019

(54) DEVICE FOR ALIGNING A COMPONENT

(71) Applicant: Carl Zeiss SMT GmbH, Oberkochen (DE)

(72) Inventor: Michael Erath, Dietenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/002,096

(22) Filed: Jun. 7, 2018

(65) Prior Publication Data

US 2018/0284626 A1 Oct. 4, 2018

Related U.S. Application Data

(63) Continuation of application No. PCT/EP2016/077526, filed on Nov. 14, 2016.

(30) Foreign Application Priority Data

Dec. 17, 2015 (DE) ........................ 10 2015 225 537

(51) Int. Cl.
*G03F 7/20* (2006.01)
*H02N 15/00* (2006.01)

(52) U.S. Cl.
CPC ...... *G03F 7/70825* (2013.01); *G03F 7/70141* (2013.01); *H02N 15/00* (2013.01)

(58) Field of Classification Search
CPC ............. G03F 7/70141; G03F 7/70825; G03F 7/70116; G03F 7/70075
USPC ......................................... 355/53, 67, 72–76
See application file for complete search history.

(56) References Cited

U.S. PATENT DOCUMENTS

| | | | |
|---|---|---|---|
| 2004/0001188 | A1 | 1/2004 | Janssen et al. |
| 2004/0179192 | A1 | 9/2004 | Mizuno et al. |
| 2005/0030653 | A1 | 2/2005 | Holderer et al. |
| 2011/0267596 | A1 | 11/2011 | Muehlberger et al. |
| 2013/0076467 | A1 | 3/2013 | Compter et al. |
| 2013/0314681 | A1 | 11/2013 | Erath et al. |
| 2015/0227053 | A1 | 8/2015 | Rassel et al. |

(Continued)

FOREIGN PATENT DOCUMENTS

| | | |
|---|---|---|
| DE | 10 2009 054 549 A1 | 6/2010 |
| DE | 10 2011 004 607 A1 | 1/2012 |
| DE | 10 2011 088 735 A1 | 6/2012 |

(Continued)

OTHER PUBLICATIONS

International Search Report and Written Opinion for corresponding Appl No. PCT/EP2016/077526, dated Feb. 6, 2017.

(Continued)

*Primary Examiner* — Hung Nguyen
(74) *Attorney, Agent, or Firm* — Fish & Richardson P.C.

(57) ABSTRACT

The disclosure provides a device for aligning a component via a guide member. A head region of the guide member is secured at a fixing point of the component, and a foot region of the guide member is secured at a fixing point of an actuating element of an actuating facility. The actuating facility is configured to hold the guide member moveably in a movement axis for the purpose of transmitting a force to the component. An adjusting facility is provided to adjust the fixing point of the actuating element so that an angle between the movement axis and the course of the guide member between the fixing points is variable.

20 Claims, 6 Drawing Sheets

1 11 2 6 7 5 14 14 8 4 12 9 10 15 V

(56) References Cited

U.S. PATENT DOCUMENTS

| | | | | |
|---|---|---|---|---|
| 2016/0225477 | A1* | 8/2016 | Banine ............... | G02B 27/0025 |
| 2017/0038555 | A1* | 2/2017 | Horn .................. | G02B 26/0841 |

FOREIGN PATENT DOCUMENTS

| | | | |
|---|---|---|---|
| WO | WO 2005/026801 | A2 | 3/2005 |
| WO | WO 2013/142083 | A2 | 9/2013 |

OTHER PUBLICATIONS

German Office Action, with translation thereof, for corresponding DE App No. 10 2015 225 537.9, dated Sep. 16, 2016.

* cited by examiner

DEVICE FOR ALIGNING A COMPONENT

CROSS-REFERENCE TO RELATED APPLICATIONS

The present application is a continuation of, and claims benefit under 35 USC 120 to, international application PCT/EP2016/077526, filed Nov. 14, 2016, which claims benefit under 35 USC 119 of German Application No. 10 2015 225 537.9 filed Dec. 17, 2015. The entire disclosure of these applications are incorporated by reference herein.

FIELD

The disclosure relates to a device for aligning a component, an actuating facility for a device for aligning, influencing and/or actuating a component, and projection exposure apparatus for semiconductor lithography that includes an illumination system with a radiation source and an optical unit.

BACKGROUND

Devices for aligning a component are used for a multiplicity of tasks in the prior art. By way of example, drive elements, also called actuators, are used in measurement, control and regulation technology to convert electrical signals into mechanical work. In this regard, it is possible for example for valves to be driven, drive elements to be operated or objects to be lifted. Devices for aligning a component can also be used to stabilize a component or to adjust the alignment thereof. By way of example such a device can be used to take up the weight force of a component and to mount the component.

In projection exposure apparatuses for semiconductor lithography, a multiplicity of actuators, for example plunger coil actuators, are usually used in order to mechanically influence and/or manipulate and/or deform components, in particular optical elements in the illumination system of the projection exposure apparatuses, in order for example to control the beam path of a radiation source.

WO 2005/026801 A2 discloses adjusting optical elements for EUV projection exposure apparatuses, such as mirrors, using driveable movement axes via actuating facilities in the form of Lorentz actuators in a plurality of degrees of freedom. Plunger coil actuators can be used for this purpose, wherein a linearly moveable actuating element, a translator, in the form of a magnet can be moved by electromagnetic interaction with a statically mounted coil surrounding the translator. In this case, the translator is connected via a guide member to the optical element to which a movement carried out is transmitted.

On account of the advancing miniaturization of semiconductor circuits, the desired properties for resolution and accuracy of projection exposure apparatuses are equally increasing. Correspondingly stringent desired properties are also made of the actuator arrangement which mechanically controls the optical elements in the illumination system.

It can be advantageous if the actuators for adjusting the optical elements and the optical elements themselves are decoupled from weight forces as much as possible. Preferably, the actuators adjust the optical elements in the weight-free or apparently force-free state. For this purpose, actuating facilities in the form of so-called weight or gravitation compensation facilities are used which take up the weight forces—at least a large portion of the weight forces—of the optical elements. As a result, the actuation of the optical elements by the actuators is simplified and a lower energy input into the actuators is desired. This in turn has positive effects on the overall behaviour of the projection exposure apparatus, since for example no additional thermal loads on account of the high energy consumption of the actuators are introduced into the installation.

A gravitation compensation facility for optical elements in projection exposure apparatuses is known from DE 10 2009 054 549 A1.

Plunger coil actuators or Lorentz actuators can be used for gravitation compensation. One potential issue here is that the actuators have to be continuously energized, on account of their design, in order to compensate for the static weight force acting on the optical element. The consequence can be a non-negligible evolution of heat, proceeding from the plunger coil actuators to the components, and hence an impairment of the image resolution. A modification of the concept of a plunger coil actuator for weight compensation is known from DE 10 2011 004 607 A1.

A passive weight compensation facility is known from US 2004/0179192 A1. It is proposed to use one or more passive spring elements, for example elastic springs or permanent magnetic fields. However, such spring elements can have the issue of a corresponding mechanical or magnetic stiffness. If the component is intended to be deflected from its neutral position by the actuator, the actuator at least partly compensates for the restoring force acting on the spring, which in turn can results in an undesirable increased energy consumption with resulting production of heat.

Furthermore, a pneumatic weight compensation facility is known from US 2004/0001188 A1. Here a gaseous medium, for example air, is introduced into a pressure chamber, wherein, via a cylinder and a piston, a corresponding force can be exerted on a wafer stage connected to the piston, for the weight force compensation of the wafer stage.

What weight compensation facilities and actuators (in particular linear motors) in the prior art have in common is that an adjustable guide member couples the weight or gravitation compensation facilities and the actuators to the component to be aligned. In this case, the guide member provided for aligning the component can be secured by a head region at a fixing point of the component to be aligned, e.g. an optical element. A foot region of the component can be secured at an actuating element of the actuating facility, e.g. a weight or gravitation compensation facility. Owing to parts tolerances and tolerances in the mounting of individual parts and assemblies, it can happen that one or both mounting or fixing points of the guide member deviate from the setpoint position. Furthermore, it can happen that the actuating facility overall or the component to be aligned and thus also the respectively assigned fixing point are not situated in the setpoint position. By way of example, alignment errors in a range of a few 100 micrometers can occur in projection exposure apparatuses. Such alignment errors can result in considerable differences in the force vector direction in relation to the component, for example a mirror, which can in turn lead to undesired parasitic effects on the mirror and to undesired actuator loads. This can also result in greater evolution of heat.

To reduce mounting errors, particularly in projection exposure apparatuses, a correspondingly great effort is expended during the mounting of the system in order that the components coupled via the adjustable guide member are positioned as optimally as possible with respect to one another. In this case, the movement axis of the guide member should correspond as far as possible to the course of the guide member between its two fixing points. An aggravating additional factor is that, after basic mounting, accessibility to the actuator or to the weight compensation facility is possible only to a limited extent. Moreover, components that are possibly introduced into the installation later can cause further alignment errors which were not able to be taken into account at the time of the basic mounting. A complete compensation of the alignment errors during mounting is therefore not possible or very complex.

SUMMARY

The disclosure seeks to provide a device for aligning a component in which a guide member is positioned as optimally as possible.

The present disclosure also seeks to provide an actuating facility for a device for aligning, influencing and/or actuating a component in which a guide member is positioned as optimally as possible.

The present disclosure further seeks to provide a projection exposure apparatus for semiconductor lithography in which the alignment of the optical element to be aligned is optimized.

In a general aspect, the disclosure provides a device for aligning a component comprising a guide member. A head region of the guide member is secured at a fixing point of the component, and a foot region of the guide member is secured at a fixing point of an actuating element of an actuating facility. The actuating facility is configured to hold the guide member moveably in a movement axis for the purpose of transmitting a force to the component. An adjusting facility is provided in order to adjust the fixing point of the actuating element in such a way that an angle between the movement axis and the course of the guide member between the fixing points is variable.

In a general aspect, the disclosure provides an actuating facility for a device for aligning a component. The actuating facility includes a guide member and a movement element held moveably along a movement axis. The actuating element has a fixing point, at which a foot region of the guide member is secured. An adjusting facility is provided to displace the fixing point orthogonally with respect to the movement.

Advantageous embodiments, variants and configurations of the device according to the disclosure are presented in greater detail below, wherein the features presented below can analogously also be realized in the actuating facility according to the disclosure. Therefore, without this being highlighted separately in each case, the following description also relates to configuration variants for the actuating facility which can preferably be used in the device according to the disclosure for aligning a component. However, the actuating facility according to the disclosure is also suitable, in particular, for influencing and/or actuating an arbitrary component.

The device according to the disclosure includes a guide member, wherein a head region of the guide member is secured at a fixing point of the component and a foot region of the guide member is secured at a fixing point of an actuating element of an actuating facility, wherein the actuating facility is designed to hold the guide member moveably in a movement axis for the purpose of transmitting a force to the component.

The actuating facility can be, for example, an actuator of, in particular, a linear motor for manipulating and/or adjusting and/or deforming a component. The actuating facility can also be, in particular, a facility for weight compensation or mounting of a component, in particular of an optical element.

The weight or gravitation compensation facility is designated hereinafter in summarized form as weight compensation facility.

The guide member can preferably be a part of a translator. A translator is the actuating element of a linear motor, for example of a Lorentz actuator in the form of a plunger coil actuators. However, the guide member can also be a part of a rotor or a part of a piston, in particular a part of a piston of a force transmission element of an actuating facility, for example of a weight compensation facility. The guide member can have an arbitrary construction, in principle. Typically, the guide member will have a section running straight or linearly between the two fixing points. Such a configuration is particularly suitable for transmitting or taking up forces. In this case, an angle $\alpha$ between the movement axis and the course of the guide member between the fixing points can be determined in a simple manner. If, in one particular configuration that is likewise encompassed by the disclosure, provision is made for the section of the guide member between the fixing points not to run straight or linearly, the course of the guide member between the fixing points can be determined by placing a straight line through the two fixing points and using it as a reference variable for the course of the guide member in order to determine the angle $\alpha$.

The actuating facility is preferably embodied as a weight compensation facility and/or as an actuator for mounting and/or manipulating and/or adjusting and/or deforming a component. The component can be, for example, an optical element, in particular a lens element or a mirror of a projection exposure apparatus. However, the disclosure is not restricted thereto. An arbitrary component can be aligned using the solution according to the disclosure.

A weight compensation facility is able, via the guide member, to take up or partly take up the weight forces of the component to be aligned and/or a weight force acting on the component to be aligned via a corresponding counterforce and possibly also to align the component.

In addition to the weight of the component, a weight compensation facility can also compensate for or take up the weight of component parts connected to the component, for example parts of an actuator arrangement or of the weight compensation facility itself. The device according to the disclosure can preferably be used in association with weight compensation facilities.

A device for weight compensation can also be used as an actuator.

According to the disclosure, an adjusting facility is provided in order to adjust the fixing point of the actuating element in such a way that an angle between the movement axis and the course of the guide member between the fixing points is variable.

By virtue of the fact that the angle between the movement axis and the course of the guide member is variable via the adjusting facility, it is possible to optimally set the force vector acting on the component. Preferably, the angle between the movement axis, that is to say the axis along which the guide member is displaceable or at least held moveably, preferably in both directions, by the actuating facility, and the course of the guide member is 0°. That is to say that the guide member is preferably intended to be mounted such that the guide member is aligned parallel to the movement axis. On account of mounting and parts tolerances, however, this is not achievable exactly. Each angular deviation between the movement axis and the course of the guide member has the effect that a further force vector, on account of the angular deviation, is applied to the component to be aligned, in addition to the force in the direction of the movement axis. This can lead to an error in the alignment of the component which can be wholly or partly corrected via the solution according to the disclosure.

By way of example, in projection exposure apparatuses in which the device according to the disclosure can be used, errors or deviations in the alignment of a component, of an optical element in this case, are usually unacceptable, for which reason the deviation in alignment is compensated for. For this purpose, it is customary for further actuators that act on the component to correct the alignment of the component. However, the operation of the actuators has the disadvantage, inter alia, of corresponding evolution of heat, which should be avoided as much as possible particularly in the case of projection exposure apparatuses.

Especially in the case of projection exposure apparatuses, weight compensation facilities are used, the task of which is to take up the weight force of the component, in particular of an optical element, and possibly further component parts, such that the actuators used for aligning and/or manipulating and/or adjusting and/or deforming the optical element do not have to take up any or any significant weight forces. Therefore, the actuators can be designed in a correspondingly optimized manner. In the case of a non-optimum alignment of the guide member of a weight compensation facility, that is to say an angular deviation between the movement axis and the course of the guide member, however, the actuators that are inherently provided only for the alignment (and the like) of the optical element additionally and permanently counteracts a force vector resulting from the angular deviation.

Advantageously, the guide member can be aligned along the gravitation direction. It can thus be ensured that no transverse forces or other parasitic forces occur. By avoiding undesired parasitic forces, the weight force of a component can be taken up as well as possible and/or a movement of an actuator arrangement involved can be transmitted virtually optimally to the component. As a result, it may be expected that the current consumption of an active device for aligning the component is reduced and a disturbing evolution of heat is thus avoided. Furthermore, deformations in the components as a result of a "pendulum effect" produced by the transverse forces can be avoided or at least suppressed. In particular, the dynamic characteristic of the device can be improved by the solution according to the disclosure.

According to the disclosure, it can be provided that the adjusting facility is designed to adjust the fixing point of the actuating element orthogonally with respect to the movement axis.

By virtue of the possibility of adjusting the actuating element orthogonally with respect to the movement axis, what can be achieved in a particularly simple manner is that the foot region of the guide member is positioned such that the guide member is aligned in the desired manner, preferably in such a way that the angle between the movement axis and the course of the guide member is 0°.

According to the disclosure, it can furthermore be provided that the adjusting facility is designed to adjust the fixing point of the actuating element in such a way that the guide member is aligned parallel, preferably coaxially, to the movement axis.

For most applications, particularly in the case of projection exposure apparatuses, it is advantageous if the fixing point of the actuating element is adjusted in such a way that the guide member is aligned parallel, preferably coaxially, to the movement axis. Preferably, the movement axis here runs in such a way that the head region of the guide member runs orthogonally with respect to a surface of the component if the head region of the guide member is fixed at a fixing point of the component.

According to the disclosure, it can be provided that the adjusting facility is designed to adjust the fixing point of the actuating element after the foot region of the guide member has been secured at the fixing point of the actuating element.

Adjusting the foot region after the guide member has been secured has the advantage that this can be carried out at a time when all the mounting steps that can have an effect on the alignment of the guide member have already been carried out. An exact alignment of the guide member is thus carried out at a time at which all parts and mounting steps relevant in this regard have already been carried out. In other words, a variation of the fixing point according to the disclosure can be effected for the almost finally completed system or the finally completed system. Such an intervention in a system would often be possible only in a complex manner at this time of mounting using conventional methods from the prior art, in particular for projection exposure apparatuses.

According to the disclosure, it can furthermore be provided that the adjusting facility includes an adjusting module in order to displace the actuating facility.

Such an adjusting module can be arranged in particular between the adjusting facility and an immobile frame or a stationary housing part. Since the actuating element and thus the fixing point of the actuating element is part of the actuating facility or can be connected thereto, it is possible in this way, by displacing or adjusting the actuating facility itself, also to vary the fixing point of the actuating element relative to the component to be aligned. As a result, the adjusting facility can be adjusted for example orthogonally with respect to the movement axis. The adjusting module can also be arranged and/or designed to adjust the actuating facility in the direction of the movement axis. A tilting of the actuating facility can also be provided. In particular, the adjusting module can be designed to displace the actuating facility in one, two or three spatial directions and/or to rotate/tilt it about one, two or three axes. The adjusting module can thus be designed to adjust the actuating facility in all six degrees of freedom.

The actuating facility can be adjusted manually or by motor, e.g. via an actuator or manipulator. The adjustment can be carried out under open-loop or closed-loop control, in particular also from outside the actuating facility. In this case, the adjustment can be carried out at any time, e.g. initially or even during the operation of the device.

Advantageously, the actuator or the weight compensation facility can be designed in such a way that additional moments that arise in the case of an off-centre position of the fixing point are compensated for.

According to the disclosure, it can be provided that the adjusting facility includes an adjusting unit in order to displace the fixing point of the actuating element relative to the actuating element It has been found that displacing the fixing point of the actuating element relative to the actuating element is a technically and economically expedient procedure. Particularly for linearly guided weight compensation facilities or actuators, such a base point correction can be an advantageous solution. An adjustment of the base point of the actuating element can be achieved structurally more simply and more cost-effectively than an adjustment of the entire actuating facility. The adjustment of the fixing point is preferably carried out orthogonally with respect to the movement axis.

According to the disclosure, it can be provided that the device for aligning the component includes an adjusting module for displacing the actuating facility, on the one hand, and an adjusting unit for displacing the fixing point of the actuating element, on the other hand.

This combination enables an adjustment divided between the adjusting unit and the adjusting module.

According to the disclosure, it can furthermore be provided that the adjusting module and/or the adjusting unit are/is also accessible after the foot region of the guide member has been secured and preferably also after final mounting of an overall system including these component parts.

The adjustment can be carried out manually, i.e. mechanically. However, the adjustment can also be carried out via an actuator. It goes without saying that an adjustment can be provided at any time, e.g. initially or even during the operation of the device.

According to the disclosure, it can additionally be provided that the fixing point of the actuating element is part of the adjusting unit. This embodiment makes it possible for the adjusting unit to adjust the fixing point directly or immediately.

According to the disclosure, it can be provided that the fixing point of the actuating element and/or the adjusting unit are/is adhesively bondable and/or clampable and/or screwable for fixing in an end position.

According to the disclosure, it can furthermore be provided that the adjusting unit has a hole and a fixing mechanism for securing the fixing point of the actuating element, wherein the hole has a play in order to adjust the fixing point of the actuating element by displacing the fixing mechanism. The term hole encompasses in this regard any form of a perforation, in particular also a milled-out hole or an elongated hole.

Via such an adjusting unit in the manner of an interface plate in which one or more holes or perforations are provided, the fixing point can easily be adjusted and secured. A hole with play constitutes a particularly simple possibility for aligning the fixing point for the foot region of the guide member. Provision can be made, for example, for using as a fixing mechanism a screw or the like which can be displaced within the tolerance range to be compensated for in the hole. In this case, the fixing point at which the guide member is secured is attached to the screw. A displacement of the screw within the hole thus leads equally to a displacement of the fixing point. As soon as the fixing point is correspondingly aligned, the screw can be fixed in the hole, for which purpose, if appropriate, further screw elements are used. Securing a screw, for example in an elongated hole, is a known measure. Alternatively, provision can also be made for the fixing point to be embodied in a pin-shaped fashion and to project into the hole, wherein the fixing point can be displaced repeatedly within the desired tolerance range, and wherein after a corresponding alignment a curing adhesive or foam is introduced into the hole or into other contact regions and fixes the fixing point after curing. In this case, too, the fixing point can be secured at the pin.

According to the disclosure, it can be provided that with the use of an adjusting unit having a hole and a fixing mechanism, the fixing point is adjustable orthogonally with respect to the movement axis in two directions. It goes without saying that an adjustment can also be provided only in one spatial direction, for which purpose an elongated hole can be used as the hole.

According to the disclosure, a tilting of the fixing point can also be provided. For this purpose, the fixing mechanism can be designed correspondingly or additional elements such as taper washers or bevelled screw nuts can be provided in combination with the fixing mechanism. A tilting of the fixing point of the actuating element can also be achieved by the use of a pin in combination with subsequent adhesive bonding.

According to the disclosure, it can be provided that the adjusting unit includes at least one eccentric.

Eccentrics are sufficiently known from the prior art. By securing the fixing point directly or indirectly at the eccentric in such a way that the fixing point carries out an eccentric movement when the eccentric is adjusted, it is possible to adjust the position of the fixing point for the foot region of the guide member in a simple manner after the foot region has been secured in the fixing point. This can be achieved in a simple manner by rotation of the eccentric.

According to the disclosure, provision can be made for using prefabricated eccentric discs in order to set the desired eccentricity. Consequently, for example with the use of an individual eccentric, it is possible to set the fixing point within the tolerance range by arranging the eccentric in an exchangeable manner in the adjusting unit, wherein the radius on which the fixing point can move can be determined by a corresponding selection of the eccentric. By selecting an eccentric in combination with a rotation of the eccentric, it is possible to set the fixing point in two spatial directions. It is thus possible to provide a type of eccentric kit with a selection of usable eccentrics for a fitter. Alternatively, the eccentric and/or the guide member and/or the interface plate can be manufactured specifically.

According to the disclosure, it can be provided that the adjusting unit includes two eccentrics.

The use of two eccentrics which are coupled to one another makes it possible to freely move a fixing point connected to one of the eccentrics within a predefined circle in two spatial directions.

According to the disclosure, the eccentrics can be designed as eccentric sleeves and/or eccentric discs.

According to the disclosure, it can be provided that one eccentric is designed as an inner eccentric and is arranged rotatably in a hole of a second eccentric, which is designed as an outer eccentric, wherein the outer eccentric is arranged rotatably in a hole of the adjusting unit.

The inner eccentric is preferably arranged rotatably in an off-centre hole of the outer eccentric. As a result of the rotation of the outer eccentric, the inner eccentric thus moves on an eccentric path. As a result of the rotation of the inner eccentric within the hole of the outer eccentric, a point defined off-centre on the inner eccentric moves on a further eccentric circular path. The two rotational movements enable an off-centre point of the inner eccentric to be arranged arbitrarily within a defined circle area. For this purpose, it is especially suitable to design the outer and inner eccentrics in each case as a sleeve or as a disc. If the fixing point is connected to the off-centre point of the inner eccentric, the fixing point can thereby be adjusted in a technically simple manner.

According to the disclosure, it can also be provided that an upper eccentric is connected rotatably to a lower eccentric, and the lower or the upper eccentric is arranged rotatably on the adjusting unit. A solution is thus also conceivable in which one eccentric is not situated in a further eccentric, rather they are coupled to one another such that one lies on top of the other.

According to the disclosure, it can be provided that a joint is provided for securing the foot region of the guide member at the fixing point of the actuating element.

The use of a joint makes it possible, particularly in combination with the adjusting facility, to further improve the alignment of the guide member. In particular, the fixing point can be extended by at least one degree of freedom of rotation (also called degree of freedom of tilting), as a result of which possible stresses at the base point of the guide member are avoided or at least reduced further. Preferably, the joint enables a rotation about one axis or about two or these axes running at right angles with respect to one another.

The joint can be configured in such a way that the guide member can preferably be rotated in all three degrees of freedom of rotation.

According to the disclosure, it can furthermore be provided that the joint has a slotted ball and a guide ring, wherein the ball receives the foot region of the guide member, and the ball is mounted in the guide ring.

Such a joint, which is also referred to as a ball-and-socket joint, constitutes a measure that can be realized in a technically simple manner.

According to the disclosure, it can be provided that the joint is fixed, in particular adhesively bonded and/or clamped and/or screwed, after the alignment of the fixing point in the adjusted end position.

According to the disclosure, it can be provided that the actuating facility in the design as weight compensation facility is preferably designed as a magnetic perturbational force compensation facility. In particular, a passive magnetic gravitational force compensation facility using permanent magnets can be provided. Alternatively, a magnetic gravitational force compensation facility using active components such as coils or using an electropermanent magnet or electromagnet can also be provided.

According to the disclosure, it can furthermore be provided that the component to be aligned is an optical element, preferably a mirror or a lens element. The component can also be a wafer, a wafer stage or some other component part, in particular within a projection exposure apparatus.

In one embodiment of the disclosure, it can be provided that the weight compensation facility, in addition to compensating for a weight force is also used for deflecting the component and/or for exerting a further force on the component.

In projection exposure apparatuses, in particular EUV projection exposure apparatuses, it is advantageous to provide a weight compensation of optical elements independently of the actual actuator. One concept that is often used in practice provides a plurality of magnetic gravitational force compensation facilities, hereinafter magnetic gravitational force compensators, for example three thereof, which hold the optical element, e.g. a mirror. The manipulation of the optical element can then be carried out by a plurality of actuators, preferably by six actuators—one actuator for each degree of freedom. The solution according to the disclosure can be integrated into the actuators and/or into the magnetic gravitational force compensators in order to obtain an as ideal force distribution as possible, whilst avoiding parasitic forces. An actuator pair is often used in combination with a weight compensation facility. In this case, the disclosure can be realized in the actuator pair and/or the weight compensation facility.

The disclosure also relates to an actuating facility for a device for aligning, influencing and/or actuating a component, including a guide member and an actuating element held moveably along a movement axis. In this case, the actuating element has an actuating point, at which a foot region of the guide member is secured. According to the disclosure, in this case an adjusting facility can be provided in order to displace the actuating point orthogonally with respect to the movement axis. The actuating facility is suitable in particular for a device for aligning a component, but is not restricted thereto. For further possible details, configurations and variants of the actuating facility, reference is made to the description above and the following description, wherein in particular the configurations mentioned in association with the actuating facility of the device according to the disclosure can also be analogously realized in the actuating facility according to the disclosure for a device for aligning, influencing and/or actuating a component.

The device according to the disclosure is particularly suitable for projection exposure apparatuses for semiconductor lithography including an illumination system with a radiation source and also an optical unit, in particular an illumination optical unit, having at least one optical element to be aligned. The device according to the disclosure can be used for mounting and/or adjusting and/or manipulating and/or deforming the optical element to be aligned.

BRIEF DESCRIPTION OF THE DRAWINGS

Advantageous embodiments and variants of the disclosure are explained by way of example below on the basis of the figures, in which.

DETAILED DESCRIPTION

Figure 1:
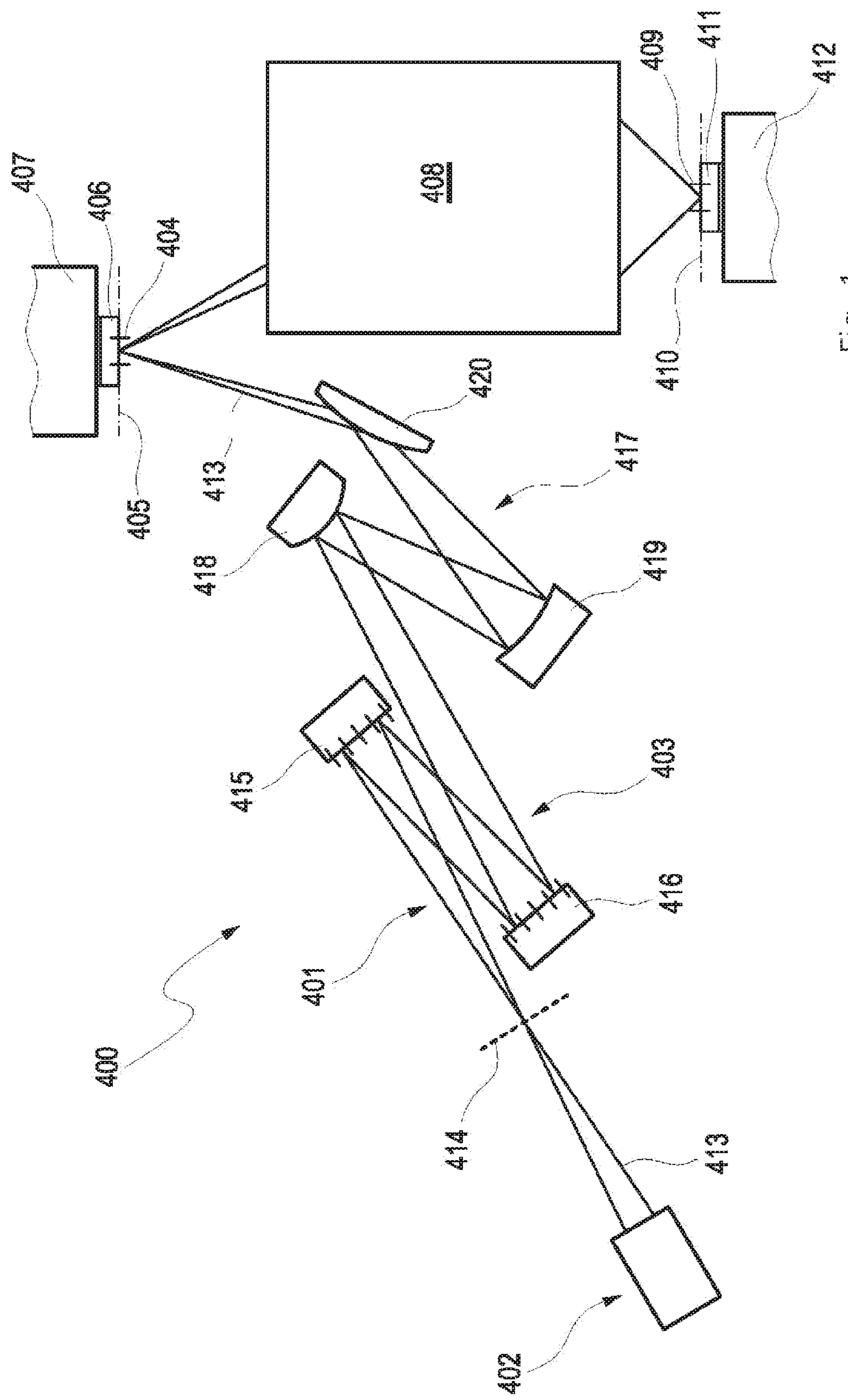
FIG. 1 shows a schematic illustration of an EUV projection exposure apparatus.

FIG. 1 shows by way of example the basic construction of an EUV projection exposure apparatus 400 for semiconductor lithography in which the disclosure can find application. An illumination system 401 of the projection exposure apparatus 400 includes, besides a radiation source 402, an optical unit 403 for the illumination of an object field 404 in an object plane 405. A reticle 406 arranged in the object field 404 is illuminated, the reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 held by a wafer holder 412 that is likewise illustrated in part, the wafer being arranged in the region of the image field 409 in the image plane 410. The radiation source 402 can emit EUV radiation 413, in particular in the range of between 5 nanometers and 30 nanometers. Optically differently designed and mechanically adjustable optical elements 415, 416, 418, 419 and 420 are used for controlling the radiation path of the EUV radiation 413. In the case of the EUV projection exposure apparatus 400 illustrated in FIG. 1, the optical elements are designed as adjustable mirrors in suitable embodiments, which are mentioned merely by way of example below.

The EUV radiation 413 generated via the radiation source 402 is aligned via a collector integrated in the radiation source 402 in such a way that the EUV radiation 413 passes through an intermediate focus in the region of an intermediate focal plane 414 before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419 and 420, field facets of the field facet mirror 415 are imaged into the object field 404.

Figure 2:
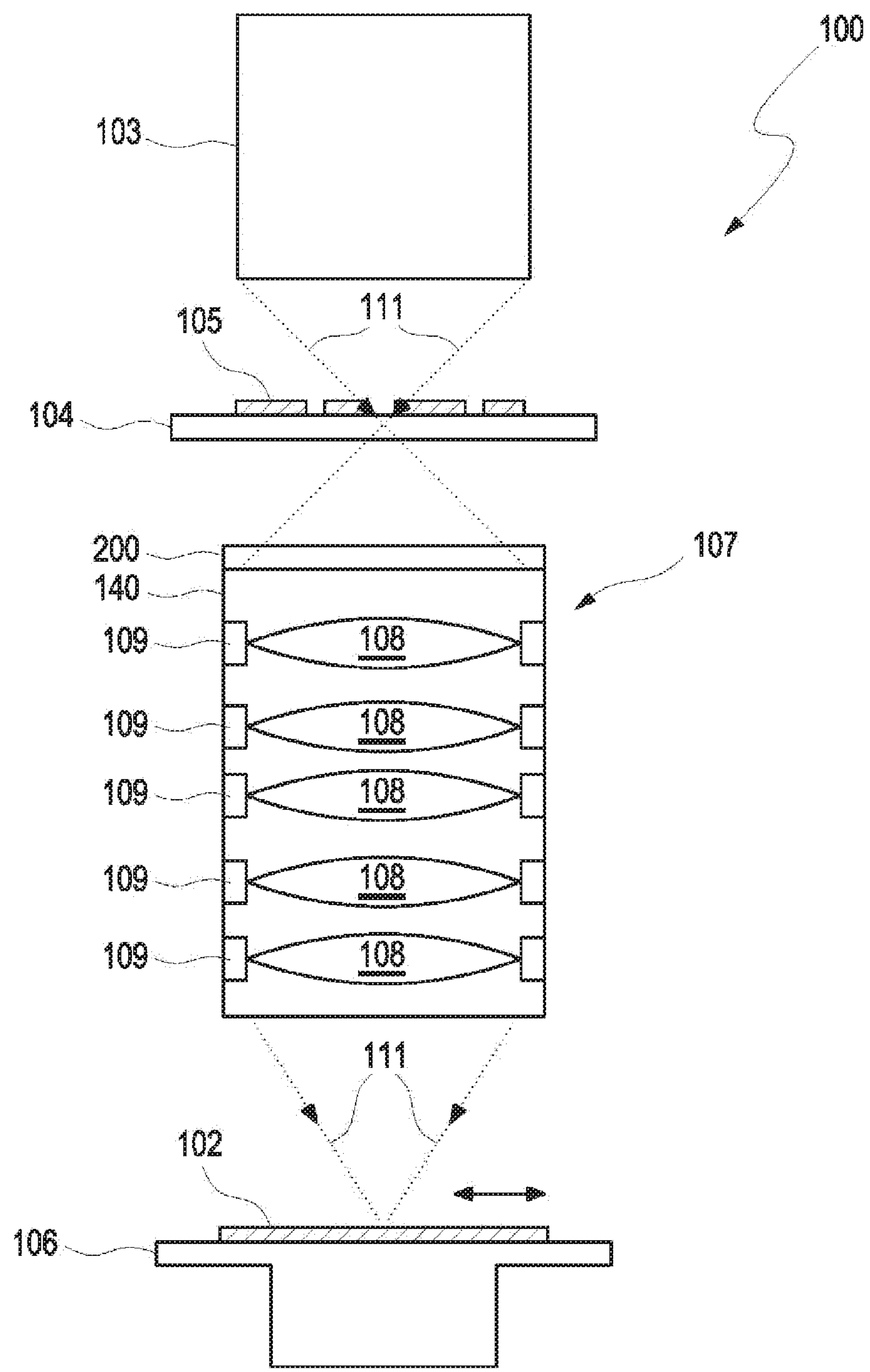
FIG. 2 shows a schematic illustration of a further projection exposure apparatus.

FIG. 2 illustrates a further projection exposure apparatus 100. The projection exposure apparatus 100 includes an illumination system 103, a device known as a reticle stage 104 for receiving and exactly positioning a reticle 105, by which the later structures on a wafer 102 are determined, a facility 106 for holding, moving and exactly positioning the wafer 102 and an imaging facility, to be specific a projection lens 107, with multiple optical elements 108, which are held by way of mounts 109 in a lens housing 140 of the projection lens 107.

The optical elements 108 can be designed as individual refractive, diffractive and/or reflective optical elements 108, such as e.g. lens elements, mirrors, prisms, terminating plates and the like.

The basic functional principle of the projection exposure apparatus 100 provides for the structures introduced into the reticle 105 to be imaged onto the wafer 102.

The illumination system 103 provides a projection beam 111 in the form of electromagnetic radiation, which is used for the imaging of the reticle 105 on the wafer 102. A laser, a plasma source or the like may be used as the source of this radiation. Optical elements in the illumination system 103 are used to shape the radiation in such a way that, when it is incident on the reticle 105, the projection beam 111 has the desired properties with regard to diameter, polarization, shape of the wavefront and the like.

An image of the reticle 105 is generated via the projection beam 111 and transferred from the projection lens 107 onto the wafer 102 in an appropriately reduced form. In this case, the reticle 105 and the wafer 102 may be moved synchronously, so that regions of the reticle 105 are imaged onto corresponding regions of the wafer 102 virtually continuously during a so-called scanning operation.

FIG. 2 shows the arrangement of a manipulator 200 in the region between the reticle stage 104 and the first optical element 108 of the projection lens 107. The manipulator 200 serves for correcting image aberrations, wherein an optical element contained is mechanically deformed by an actuator arrangement, for which purpose the device according to the disclosure can also be used.

The use of actuators of various designs is known for adjusting and/or for manipulating the optical elements 415, 416, 418, 419, 420 and 108 of the projection exposure apparatuses 400, 100 illustrated in FIGS. 1 and 2 and the wafers 411, 102.

The device according to the disclosure as illustrated in greater detail below in the exemplary embodiments with reference to FIGS. 3 to 10 is particularly suitable for aligning the optical elements 415, 416, 418, 419, 420, 108, but also the wafers 411, 102 or other components which are intended to be exactly mounted, adjusted, manipulated or deformed.

The use of the device according to the disclosure is not restricted to use in projection exposure apparatuses 100, 400, in particular also not with the construction described.

The disclosure and the following exemplary embodiment should not be understood as being restricted to a specific design of the device according to the disclosure. The features in FIGS. 3 to 10 as illustrated below can be combined arbitrarily with one another, in so far as this is not ruled out from a technical standpoint.

Figure 3:
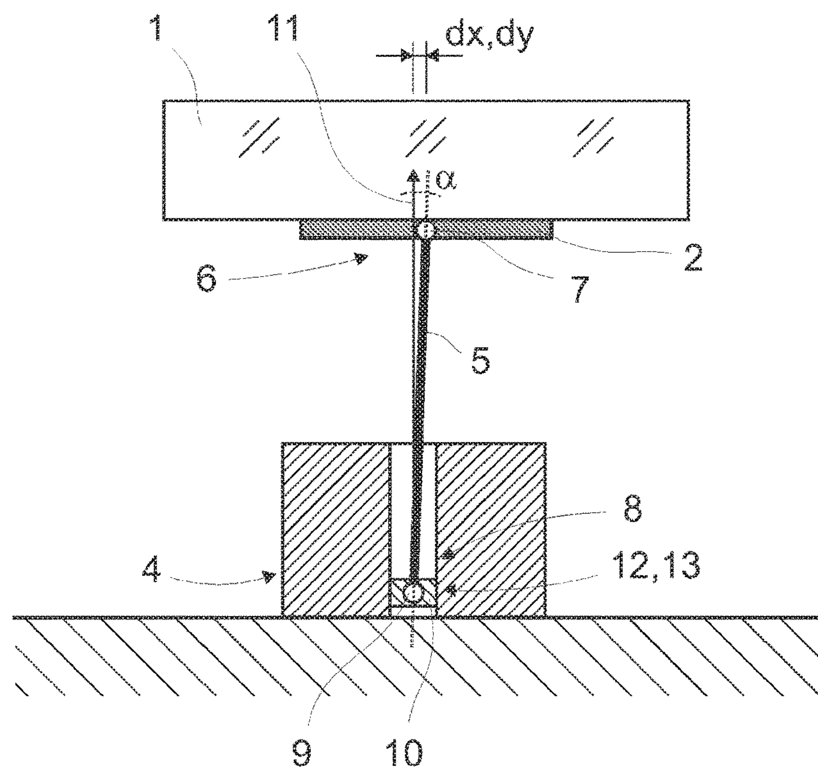
FIG. 3 shows a schematic illustration of a device according to the disclosure for aligning an optical element in a first embodiment, wherein the course of a guide member according to the disclosure deviates from a movement axis by an angle $\alpha$.

FIG. 3 shows a component 1 to be aligned in the form of an optical element 1 having a contact surface 2, wherein the optical element 1 can be aligned via an actuating facility 4 connected to the contact surface 2. The component parts are illustrated only schematically in the figures.

What is shown is an actuating facility for aligning the optical element 1 in the form of a weight compensation facility 4 with a guide member 5, wherein a head region 6 of the guide member 5 is fixed at a fixing point 7 of the optical element 1. In the exemplary embodiment, the fixing point 7 is arranged at the contact surface 2 of the optical element 1. The illustration furthermore shows that a foot region 8 of the guide member 5 is secured at a fixing point 9 of an actuating element 10 of the weight compensation facility 4. The weight compensation facility 4 is designed to hold the guide member 5 moveably in a movement axis 11 for the purpose of transmitting a compensation force to the optical element 1. In the exemplary embodiment, the guide member is designed in the form of a rod or as a linearly extending pin.

The alignment device according to the disclosure furthermore includes, as shown in FIG. 3, an adjusting facility 12. In this embodiment, the adjusting facility 12 provides an adjusting unit 13 in order to displace the fixing point 9 of the actuating element 10 relative to the actuating element 10. This is illustrated in greater detail by way of example in FIGS. 7 and 8.

The fixing point 9 of the actuating element 10 can be adjusted according to the disclosure in such a way that an angle α between the movement axis 11 and the course of the guide member 5 between the fixing points 7, 9 is variable.

FIG. 3 shows a view in which the position of the fixing point 9 of the actuating element 10 has not been compensated or has not yet been optimized. It is evident that the position of the fixing point 9 of the actuating element 10 is not situated directly below the fixing point 7 of the contact surface 2 of the optical element 1 to be aligned. The fixing points 7, 9 are displaced by a distance dx, dy in at least two spatial directions relative to the setpoint position with respect to one another. The movement axis 11 along which the weight compensation facility 4 displaces the guide member 5 does not run parallel to the guide member 5. Consequently, the weight force of the optical element 1, of the contact surface 2 and parts of further components involved, not explained in any greater detail, cannot be optimally compensated for; undesired transverse forces and parasitic moments occur. Such parasitic effects may in particular also be caused by stiffnesses in the fixing points 7, 9.

In order to avoid or reduce such parasitic forces or parasitic moments, the disclosure involves striving to adjust the fixing point 9 of the actuating element 10 orthogonally with respect to the movement axis 11, specifically in the embodiment shown in such a way that the guide member 5 is aligned parallel to the movement axis 11 after the adjustment.

The methods in the prior art enable such an alignment only at an early stage of the final assembly of a projection exposure apparatus 400, 100 and only with high technical and economic outlay. Via the solution according to the disclosure, the fixing point 9 of the actuating element 10 can still be adjusted even after the foot region 8 of the guide member 5 has been secured at the fixing point 9 of the actuating element 10.

In the exemplary embodiments, only the features relevant to understanding the present disclosure are explained in greater detail, since devices for aligning a component, in particular the optical element 1 illustrated, are sufficiently known from the prior art. The same also holds true with regard to the interaction between magnetic fields and the force effects resulting therefrom.

Figure 4:
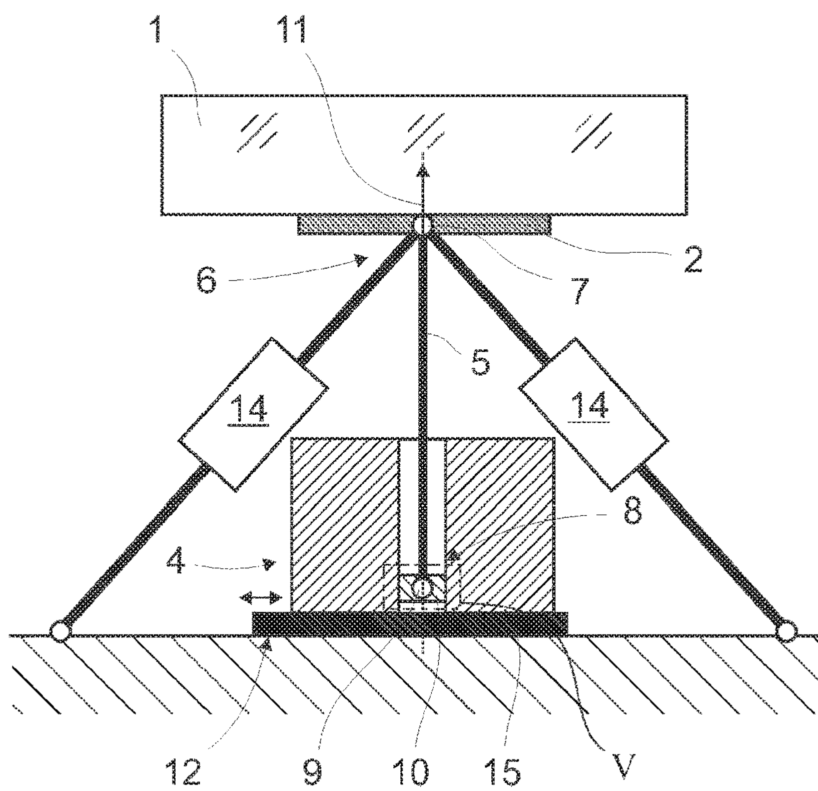
FIG. 4 shows a schematic illustration of a device according to the disclosure for aligning an optical element in a second embodiment, wherein a guide member according to the disclosure and a movement axis run parallel to one another.

FIG. 4 illustrates a second embodiment of the disclosure. Component parts which have already been described in the previous exemplary embodiment will not be described again. This also applies to the subsequent figures.

FIG. 4 likewise shows an actuating facility in an embodiment as a weight compensation facility 4 as part of the device according to the disclosure for aligning an optical element 1. The illustration furthermore shows two additional actuating facilities in the form of actuators 14, which, in the exemplary embodiment, are designed by way of example as linear motors (only indicated schematically). The actuators 14 likewise act on the fixing point 7 of the contact surface 2 of the optical element 1, at which the guide member 5 of the weight compensation facility 4 is also fixed. However, the fixing points of the actuators 14 can also differ therefrom. The actuators 14 can preferably serve to adjust and/or manipulate and/or deform the optical element 1 in one degree of freedom or a plurality of degrees of freedom.

Provision can also be made of more than two, in particular six, actuators 14 or three actuator pairs or other actuators. Provision can also be made for providing, instead of the weight compensation facility 4, a combined facility for weight compensation and actuator arrangement preferably in combination with a single further actuator 14.

In the embodiment in FIG. 4, provision can be made, in particular, for providing three alignment devices according to the disclosure, that is to say that the two actuators 14 and the weight compensation facility 4 are in each case part of a device according to the disclosure and, in particular, an adjusting facility 12 according to the disclosure is in each case provided. The actuators 14 can thus be part of a device according to the disclosure or have the corresponding configurations, as illustrated in the exemplary embodiments concerning FIGS. 3 to 10.

In the exemplary embodiment in FIG. 4, the adjusting facility 12 includes an adjusting module 15 in order to displace the weight compensation facility 4. The adjusting module 15 can be designed as an interface plate, for example, wherein the weight compensation facility 4 can be displaced orthogonally with respect to the movement axis 11 in two spatial directions in order to compensate for the displacement dx, dy, as shown in FIG. 3. FIG. 4 shows an illustration in which the fixing point 9 of the actuating element 10 has already been displaced in order to compensate for the undesired angular deviation. It is evident that, via this type of compensation, not only is the guide member 5 aligned parallel to the movement axis 11, but the courses thereof coincide. It goes without saying that a displacement in a third spatial direction along the movement axis 11 may also be advantageous in some applications. The person skilled in the art can easily provide such an adjustment on the basis of the present description of the disclosure.

The adjusting module 15 can enable a manual adjustment or displacement of the weight compensation facility 4. However, provision can also be made for an adjustment or displacement to be carried out by motor, e.g. via additional actuators or manipulators. Via the use of such an adjusting module 15, the fixing point 9 of the actuating element 10 can be adjusted in particular from outside the device or the weight compensation facility 4. The adjustment can be carried out both initially and during operation.

Figure 5:
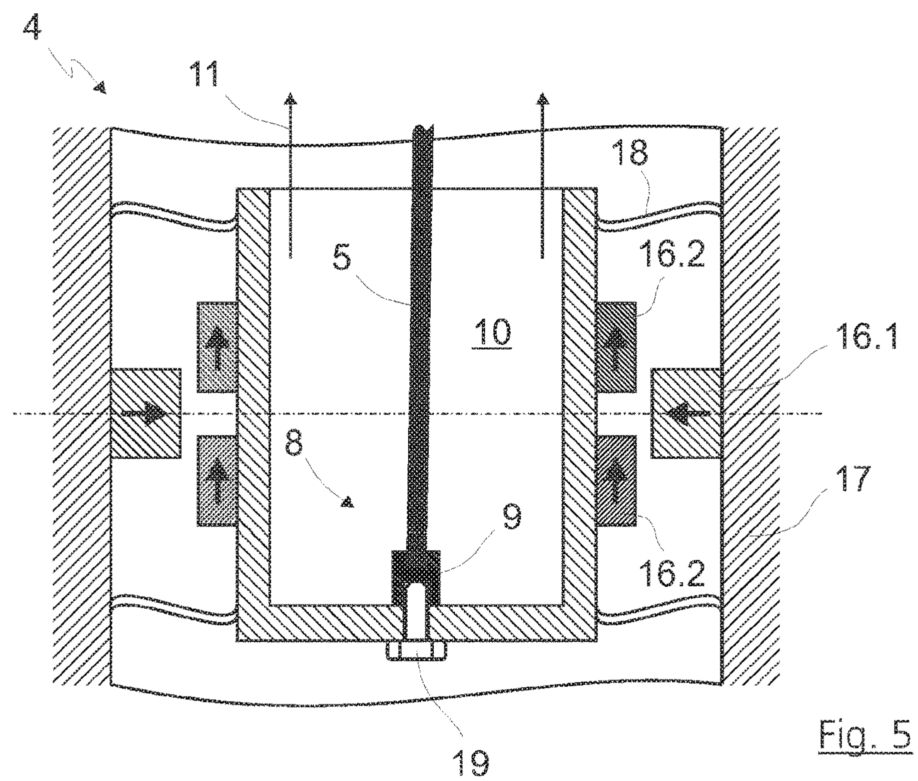
FIG. 5 shows an enlarged schematic illustration of the excerpt V in FIG. 4.

FIG. 5 shows an enlarged illustration of a section through the exemplary weight compensation facility 4. A passive magnetic gravitational force compensation facility having permanent magnets 16.1, 16.2 is involved in this example. Via a corresponding arrangement of a magnet 16.1 on a stator 17 and corresponding countermagnets 16.2 on the actuating element 10, which is held moveably together with the guide member 5 in a manner similar to a translator of an actuator, it is possible to generate the compensation force over a large region with only little variation. Merely for mechanical guidance, the guide member 5 in the exemplary embodiment is optionally mounted via leaf springs 18.

In the embodiment shown in FIG. 5, the guide member 5 is fixedly connected to the actuating element 10 by the fixing point 9 of the actuating element 10 and is fixed by a fixing mechanism 19 in the form of a screw 19. This is optional.

The fixing point 9 of the actuating element 10 can be connected to the guide member 5 rigidly or e.g. via a joint. For fixing the foot point 8 of the guide member 5 at the fixing point 9 of the actuating element 10, some other fixing, for example by adhesive bonding, can also be provided.

The functioning of a weight compensation facility 4 using passive permanent magnets 16.1, 16.2 is indicated only schematically. It is also possible to use any other weight compensation facility 4, for example a mechanical, pneumatic, hydraulic or electromagnetic weight compensation facility, in particular one of those mentioned in the prior art.

Figure 6:
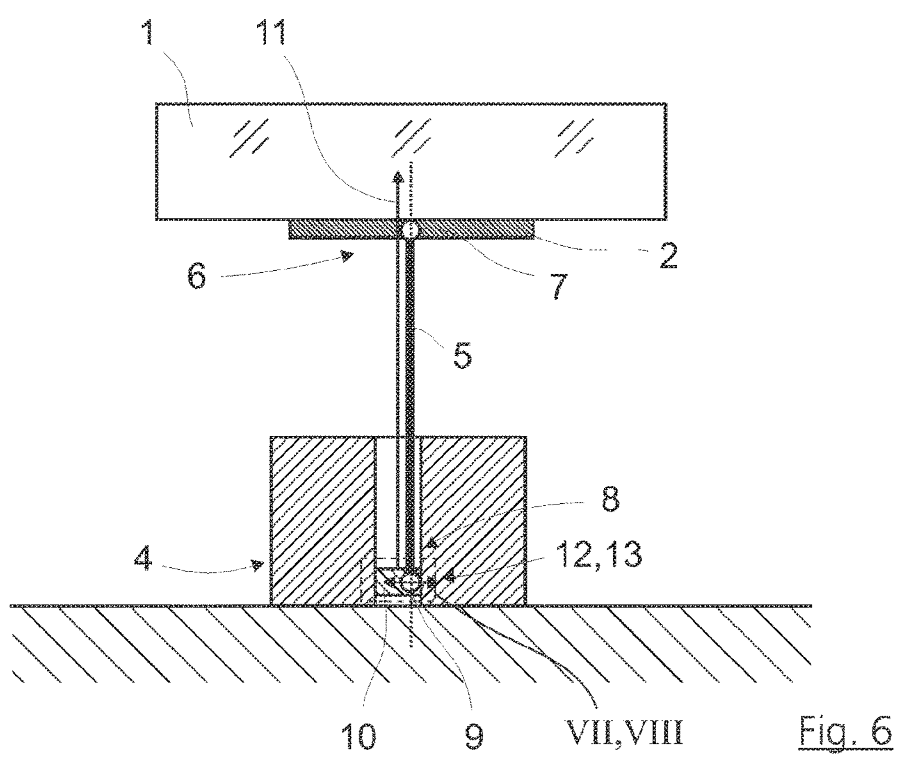
FIG. 6 shows a schematic illustration of a device according to the disclosure for aligning an optical element in accordance with FIG. 3, wherein a guide member according to the disclosure and a movement axis run parallel to one another.

FIG. 6 shows an embodiment in accordance with FIG. 3. The illustration shows how an adjusting unit 13, which is not depicted in detail, can displace the fixing point 9 of the actuating element 10 in such a way that the displacement dx, dy of the fixing points 7, 9 with respect to one another, as illustrated in FIG. 3, is compensated for. For this purpose, the movement axis 11 and the guide member 5 can be aligned parallel. The weight compensation facility 4 can be advantageously designed to compensate for the additional moments occurring as a result of the off-centre arrangement of the fixing point 9 of the actuating element 10.

Figure 7:
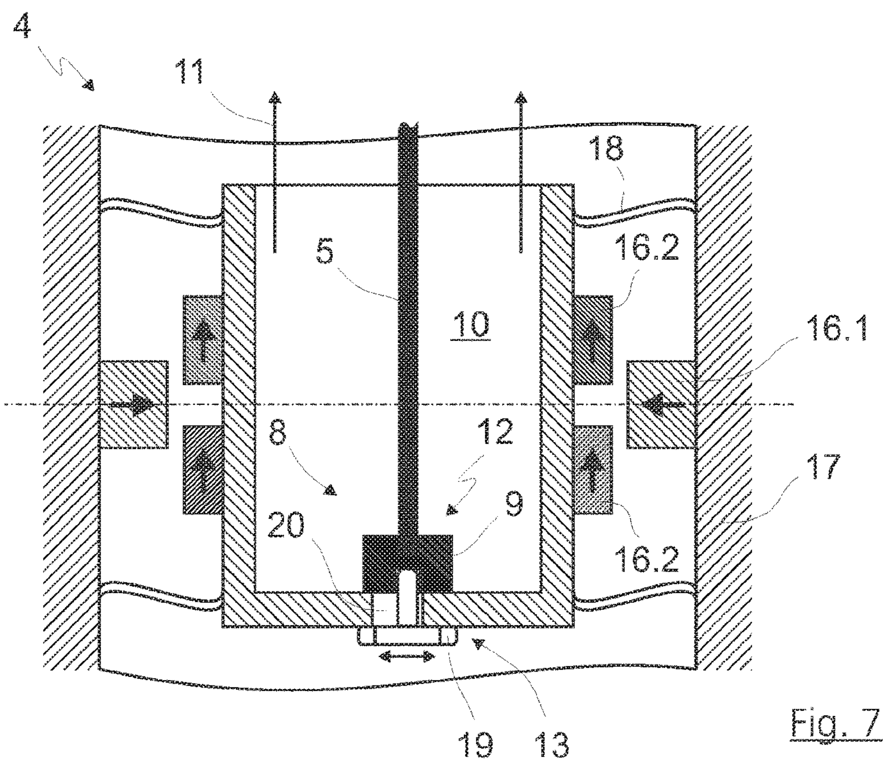
FIG. 7 shows an enlarged schematic illustration of the excerpt VII in FIG. 6 with an adjusting unit in a first embodiment.

FIG. 7 shows one possible embodiment of an adjusting unit 13 in an enlarged illustration. In the embodiment illustrated, the adjusting unit 13, for fixing the fixing point 9, has a hole 20 and the fixing mechanism 19, preferably in the form of a screw, the basic principle of which has already been shown in FIG. 5. In this case, the hole 20 has a play in order to adjust the fixing point 9 of the actuating element 10 by the displacement of the fixing mechanism 19. In this case, the fixing point 9 of the actuating element 10 can be set in one or two spatial directions by the displacement of the fixing mechanism 19. For displacement in only one spatial direction, a cutout in the form of an elongated hole can also be provided. After the desired displacement of the fixing point 9 of the actuating element 10, the fixing point 9 can be fixed. For this purpose, the fixing mechanism 19 illustrated can be tightened to an appropriate extent. Alternatively, it would also be conceivable to carry out an adhesive bonding or other clamping.

The fixing point 9 can be connected to the guide member 5 rigidly or via a joint, for example.

Figure 8:
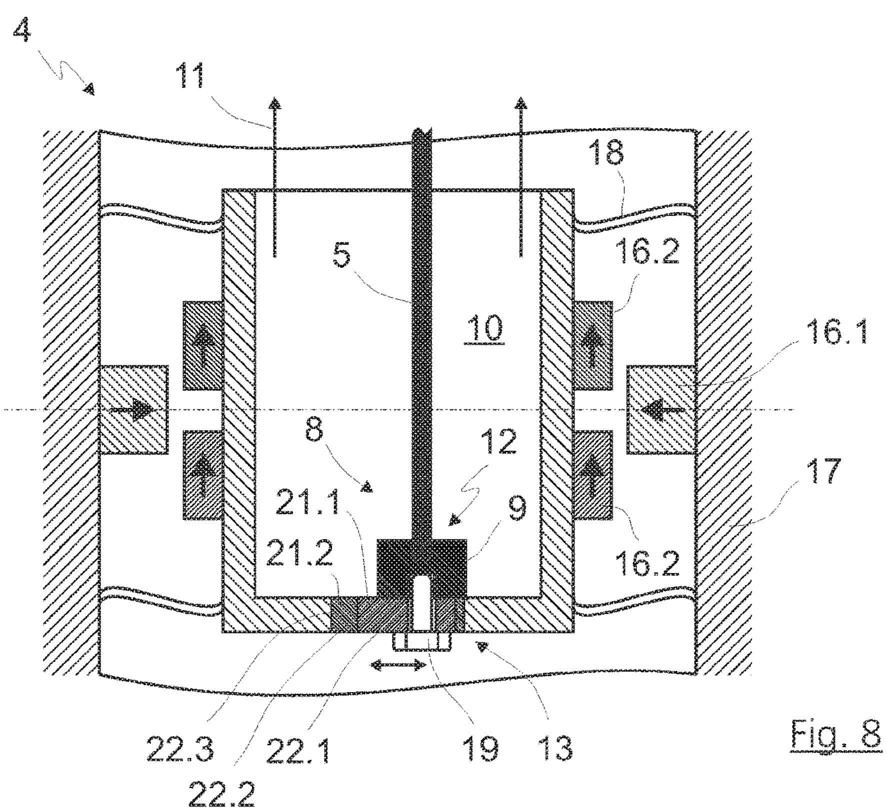
FIG. 8 shows an enlarged schematic illustration of the excerpt VIII in FIG. 6 with an adjusting unit in a second embodiment.

FIG. 8 illustrates an alternative embodiment of an adjusting unit 13. Two eccentrics 21.1, 21.2 are provided, wherein an inner eccentric 21.1 is arranged rotatably in a hole 22.2 of an outer eccentric 21.2, and the outer eccentric 21.2 is arranged rotatably in a hole 22.3 of the adjusting unit 13 or of the actuating element 10. Finally, the inner eccentric 21.1 is fixed at the fixing point 9 of the actuating element 10, by the fixing mechanism 19 in this embodiment, for which purpose a hole 22.1 can be used. This is optional. The fixing point 9 can also be formed integrally with the inner eccentric 21.1 or be connected thereto fixedly or non-releasably. Via corresponding rotation of both eccentrics 21.1, 21.2, the fixing point 9 can be set freely in a predetermined range in two spatial directions orthogonally with respect to the movement axis 11. The eccentrics 21.1, 21.2 can be designed as eccentric sleeves or eccentric discs. Analogously to the embodiment in FIG. 7, it is likewise conceivable for the connection between the fixing point 9 and the guide member 5 to be effected via a joint. Furthermore, provision can also be made for adjusting the fixing point 9 along the movement axis 11. The mounting of the eccentrics 21.1, 21.2 is indicated only schematically here. In particular, no axial securing along the movement axis 11 is illustrated. A suitable mounting of an eccentric 21.1, 21.2, for example via a securing washer of appropriate size, is a familiar measure to the person skilled in the art and, accordingly, is not described in further detail here.

Figure 9A:
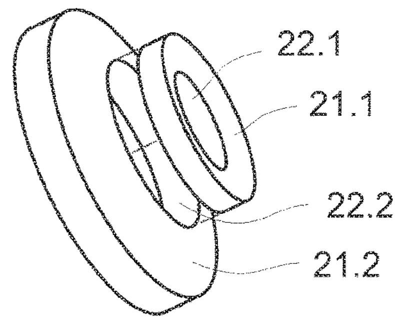
FIG. 9A shows an exploded illustration of two eccentric sleeves illustrated in terms of basic principles.

FIG. 9A shows an exploded illustration of the eccentrics 21.1, 21.2 which can be used for the disclosure. In this case, the inner eccentric 21.1 is introduced into the hole 22.2 provided off-centre in the outer eccentric 21.2. In this case, the inner eccentric 21.1 optionally likewise has an off-centre hole 22.1 for fixing the fixing point 9 of the actuating element 10.

Figure 9B:
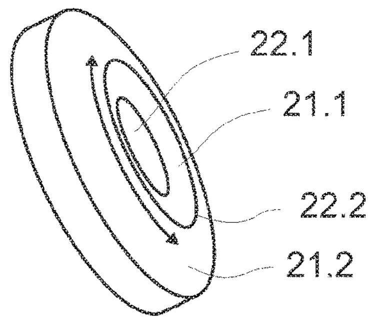
FIG. 9B shows an illustration of the eccentric sleeves according to FIG. 9A in the assembled state.

FIG. 9B shows an illustration in which the two eccentrics 21.1, 21.2 are assembled.

Figure 9C:
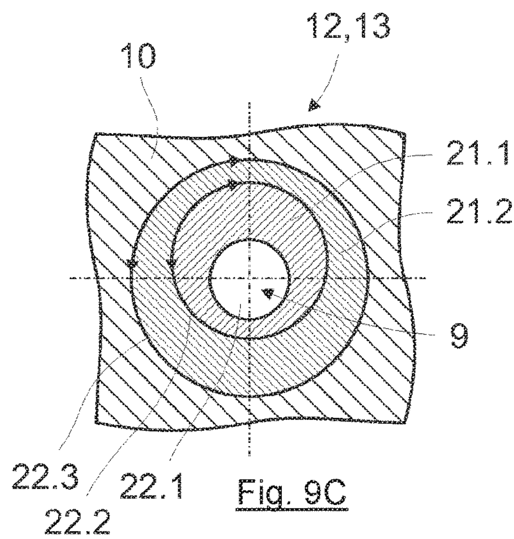
FIG. 9C shows a sectional illustration of two eccentric sleeves illustrated in terms of basic principles with a centrally aligned fixing point.
Figure 9D:
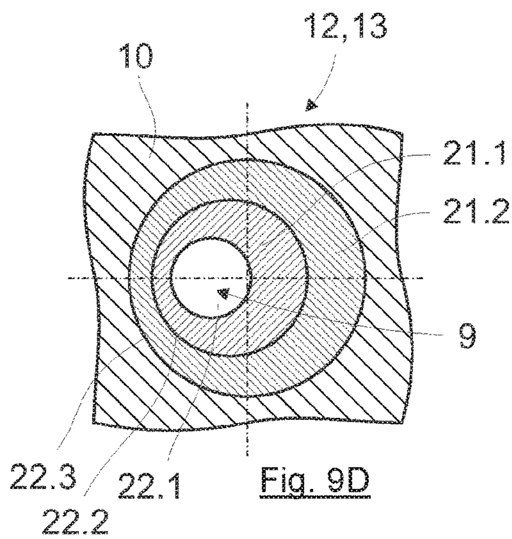
FIG. 9D shows a sectional illustration of the eccentric sleeves according to FIG. 9C, wherein the eccentric sleeves are rotated relative to one another.

FIGS. 9C and 9D illustrate how, within a predefined circle, the fixing point 9 can be displaced to an arbitrary position. For this purpose, the outer eccentric 21.2 can be rotated within the hole 22.3 of the adjusting unit 13 or of the actuating element 10 and the inner eccentric 21.1 can be rotated within the hole 22.2 of the outer eccentric 21.2.

FIG. 9C shows a central position of the fixing point 9, and FIG. 9D shows a maximum deflection in one spatial direction.

The configuration of the adjusting unit 13 with one eccentric, in particular two eccentrics 21.1, 21.2, can be realized independently of the configuration of the further features of the exemplary embodiments.

Figure 10:
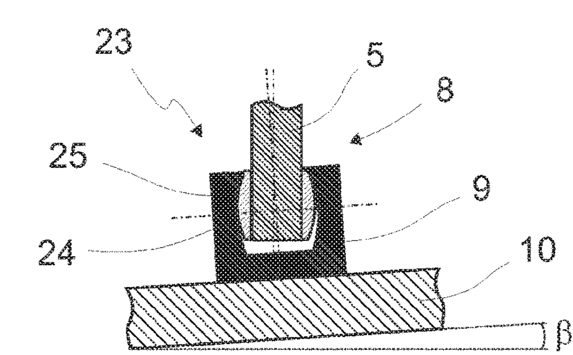
FIG. 10 shows an illustration of the basic principles of a fixing point with a joint.

FIG. 10 illustrates by way of example how a joint 23 can be used to receive the foot region 8 of the guide member 5 and to connect it to the fixing point 9 in an articulated manner. The actuating element 10 is illustrated as incorrectly aligned by an angle β, for example. The joint 23 has a slotted ball 24 and a guide ring 25. The use of such a joint 23 makes it possible also to include the degrees of freedom of rotation and/or degrees of freedom of tilting in an alteration of the fixing point 9 of the actuating element 10. After the desired alignment of the fixing point 9 of the actuating element 10, the joint 23 shown can be fixed, preferably permanently, by adhesive bonding and/or clamping and/or screwing. It goes without saying that the joint 23 illustrated by way of example in FIG. 10 can be combined with any other embodiment of the disclosure, in particular an embodiment as described in the previous figures.

What is claimed is:

1. A device configured to align a component, the device comprising:
- a guide member;
- an actuating facility comprising an actuating element; and
- an adjusting facility,
- wherein:
  - a head region of the guide member is secured at a fixing point of the component;
  - a foot region of the guide member is secured at a fixing point of the actuating element;
  - the actuating facility is configured to hold the guide member moveably in a movement axis to transmit a force to the component; and
  - the adjusting facility is configured to adjust the fixing point of the actuating element so that an angle between the movement axis and a course of the guide member between the fixing points is variable.

2. The device of claim 1, wherein the adjusting facility is configured to adjust the fixing point of the actuating element orthogonally to the movement axis.

3. The device of claim 1, wherein the adjusting facility is configured to adjust the fixing point of the actuating element so that the guide member is aligned parallel to the movement axis.

4. The device of claim 1, wherein the adjusting facility is configured to adjust the fixing point of the actuating element after the foot region of the guide member is secured at the fixing point of the actuating element.

5. The device of claim 1, further comprising an adjusting module configured to displace the actuating facility.

6. The device of claim 1, wherein the adjusting facility comprises an adjusting unit configured to displace the fixing point of the actuating element relative to the actuating element.

7. The device of claim 6, wherein the adjusting unit comprises the fixing point of the actuating element.

8. The device of claim 6, wherein at least one of the fixing points is adhesively bondable, clampable and/or screwable to fix in an end position.

9. The device of claim 6, wherein the adjusting unit comprises a hole and a fixing mechanism configured to secure the fixing point of the actuating element, and the hole has a play to adjust the fixing point of the actuating element by displacing the fixing mechanism.

10. The device of claim 6, wherein the adjusting unit comprises an eccentric.

11. The device of claim 6, wherein the adjusting unit comprises first and second eccentrics.

12. The device of claim 11, wherein the first eccentric is an inner eccentric arranged rotatably in a hole of the second eccentric, and the second eccentric is an outer eccentric arranged rotatably in a hole of the adjusting unit.

13. The device of claim 10, wherein the eccentric comprises at least one member selected from the group consisting of an eccentric sleeve and an eccentric disc.

14. The device of claim 6, wherein the component comprises an optical element.

15. The device of claim 1, further comprising a joint configured to secure the foot region of the guide member at the fixing point of the actuating element.

16. The device of claim 15, wherein the joint comprises a guide ring and a slotted ball mounted in the guide ring, and the slotted ball receives the foot region of the guide member.

17. The device of claim 16, wherein the component comprises an optical element.

18. The device of claim 1, wherein the actuating facility comprises at least one member selected from the group consisting of: a weight compensation facility; and an actuator configured to mount, manipulate, adjust and/or deform the component.

19. The device of claim 1, wherein the component comprises an optical element.

20. An apparatus, comprising:

an illumination system; and an optical unit comprising an optical element and device according to claim 1, wherein the apparatus is a semiconductor lithography projection exposure apparatus.

* * * * *

UNITED STATES PATENT AND TRADEMARK OFFICE

CERTIFICATE OF CORRECTION

PATENT NO. : 10,254,664 B2
APPLICATION NO. : 16/002096
DATED : April 9, 2019
INVENTOR(S) : Michael Erath It is certified that error appears in the above-identified patent and that said Letters Patent is hereby corrected as shown below:

In the Specification

Column 6, Line 59: Delete "element" and insert -- element. --, therefor.

Signed and Sealed this
Sixteenth Day of July, 2019

Andrei Iancu
*Director of the United States Patent and Trademark Office*